United States Patent [19]

Perring

[11] Patent Number: 4,737,738

[45] Date of Patent: Apr. 12, 1988

[54] EXTENDED INTERACTION DEVICE TUNED BY MOVABLE DELAY LINE STRUCTURE

[75] Inventor: Dudley Perring, Lisse, Netherlands

[73] Assignee: Agence Spatiale Europeenne, Paris, France

[21] Appl. No.: 48,052

[22] Filed: May 11, 1987

[51] Int. Cl.[4] .......................... H01J 25/36; H03B 9/08; H03F 3/58

[52] U.S. Cl. .......................................... 331/82; 315/3.5; 315/5.53; 315/39.3; 330/56

[58] Field of Search ............... 331/81, 82, 83; 330/56; 315/3.5, 3.6, 39.3, 5.46, 5.48, 5.53, 5.54

[56] References Cited

U.S. PATENT DOCUMENTS 3,942,066 3/1976 Kageyama et al. ............ 315/5.46 X

*Primary Examiner*—Siegfried H. Grimm

*Attorney, Agent, or Firm*—Fred A. Keire

[57] ABSTRACT

A resonant cavity arranged for an electron beam to pass therethrough, is made of two spaced apart parallel substantially planar members movable with respect to each other in a direction perpendicular to their major surfaces, at least one of said members having a delay line structure on its inner face within the gap between said two members. Means are arranged for moving the members relative to each other so as to vary the spacing between said members, whereby the oscillation frequency is tuned easily. The resonant cavity can be used to realize wide-band extended interaction oscillators and klystron amplifiers.

5 Claims, 3 Drawing Sheets

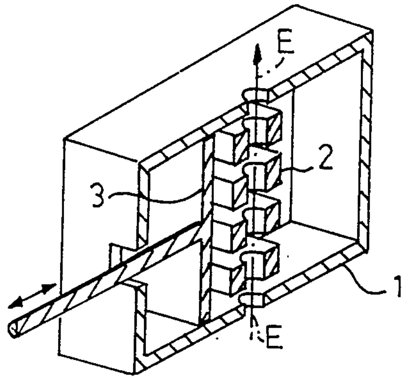
FIG. 1
PRIOR ART
FIG. 2
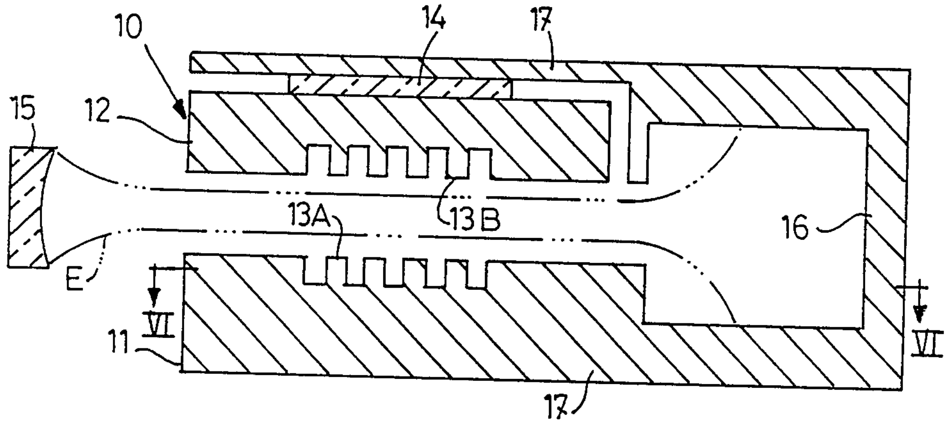
FIG. 3
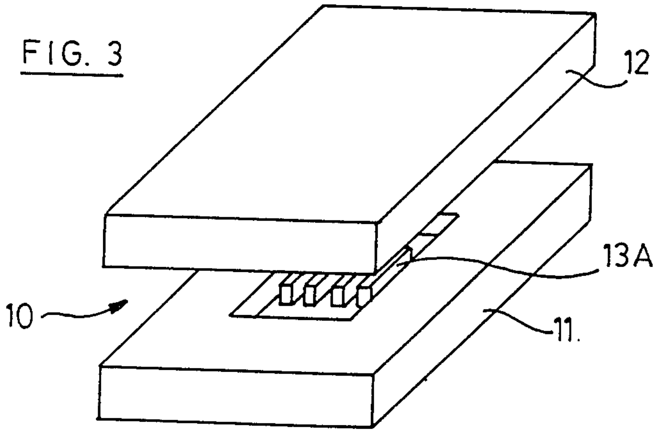

EXTENDED INTERACTION DEVICE TUNED BY MOVABLE DELAY LINE STRUCTURE

BACKGROUND OF THE INVENTION

The present invention relates to improvements in extended interaction oscillators (EIO) and Extended Interaction Klystron amplifiers (EIK), and especially to the mechanical tuning arrangement of the EIO or EIK resonant cavity such as to provide a large tunable frequency range.

The Extended Interaction Oscillator and Extended Interaction Klystron are vacuum tubes originally designed to convert direct current to R.F. power. Such devices are disclosed for instance in "Introduction to Millimeter Extended Interaction Klystrons", Varian Canada Technical Publication, April 1982. Both devices include a single resonator cavity containing a length of delay line, the cavity being arranged such that an electron beam is caused to pass therethrough.

In an EIO the gap length is sized such as to interact with the electron beam so as to induce monotron oscillation in the cavity. In an EIK the gap length is reduced and/or the R.F. loading increased such as to give a non-oscillating resonance to the cavity, so that a plurality of cavities may be arranged along and interacting with the electron beam to form an amplifier.

Mechanical tuning of the oscillation frequency in the prior art devices is provided by an inductive tuner in the wall of the resonant cavity such that it usually resonates at, but is not limited to, the Pi-frequency of the delay line, i.e. when adjacent gaps of the delay line are electronically 180° out of phase.

A disadvantage of this method of tuning is that the tuning range of the oscillation frequency is limited because the interaction frequency of the delay line is fixed and is not a function of the tuner position. The tuning range is usually limited to about 4%. As the main resonant mode of the cavity is tuned, higher order resonant modes are also tuned. However, during tuning, the natural Pi-frequency of the delay line remains constant. On progressively tuning the resonator, the Pi-mode frequency of the delay line is "pulled" by the main cavity mode until the tuned frequency of a higher order cavity mode approaches the natural Pi-frequency of the delay line, whereupon the oscillation returns to that frequency, taking on the form of the higher order mode.

Another disadvantage of the prior art tuning method is that it is technologically difficult, if not impossible, to realize both mechanically and electrically at sub-millimeter frequencies where the cavity and structure sizes are as low as about a few microns.

SUMMARY OF THE INVENTION

The object of the invention is to provide an improved extended interaction oscillator or klystron amplifier in which the interaction frequency of the delay line varies stepwise with the cavity resonant frequency, whereby the resonant frequency can be tuned over a wide band, with a geometry which allows technological ease of construction for all frequencies, particularly for submillimeter wave frequencies.

This object is achieved according to a first aspect of the invention by an extended interaction oscillator or klystron cavity comprising a resonant cavity arranged for an electron beam to pass therethrough, said cavity being made of two spaced apart parallel substantially planar members movable with respect to each other in a direction perpendicular to their major surfaces, at least one of said members having delay line structure on its inner face within the gap between said two members, means arranged for moving the members relative to each other so as to vary the spacing between said members, thereby to tune the oscillation frequency.

In accordance with a second aspect of this invention, there is provided an extended interaction oscillator or klystron comprising an oscillator or klystron cavity, comprised of a resonant cavity made of two spaced apart parallel substantially planar members movable with respect to each other in a direction perpendicular to their major surfaces, at least one of said members having a delay line structure on its inner face within the gap between said members, means arranged for moving the members relative to each other so as to vary the spacing between said members thereby to tune the oscillation frequency, a cathode arranged for producing an electron beam to enter and pass through the gap between said two members, a collector arranged for collecting the electron beam after it has passed through said gap, and output coupling means arranged to couple the R.F. output exiting the resonant cavity to an output circuit.

DESCRIPTION OF THE DRAWINGS

FIG. 1 illustrates a prior art device.

FIG. 2 is a partial view of an exemplary embodiment in accordance with the invention.

FIG. 3 is a schematic perspective view of the oscillator cavity in the embodiment of FIG. 2.

DESCRIPTION OF AN EXEMPLARY EMBODIMENT OF THE INVENTION

Figure 4A:
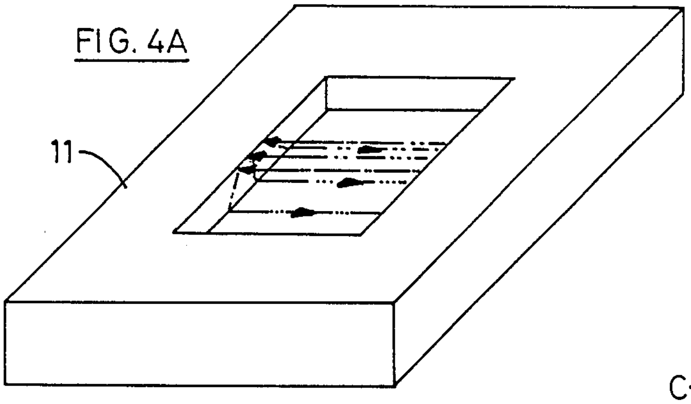
FIGS. 4A and 4B show respectively one half of the oscillator cavity of FIG. 3 and the equivalent electric circuit thereof.

Referring to FIG. 1 there is schematically shown an exemplary EIO cavity according to the prior art. The cavity box 1 contains a delay line structure 2 of the usual vane type. The electron beam produced by an electron gun (not shown) is represented by the dash line E. One wall 3 of the cavity is made movable and embodied as a piston which can be moved in a guide whose cross-section is that of the wall which it replaces. The tuning is realized by adjusting the position of said movable wall 3. The disadvantages of this prior art realization have been discussed earlier herein.

Referring now to FIG. 2 there is shown an exemplary embodiment of a device arranged in accordance with this invention. In the following, an EIO cavity is described but it is understood that the arrangement of the invention is also directly applicable to EIK cavities. The numeral 10 denotes an oscillator cavity according to the invention, the numeral 15 denotes cathode for producing an electron beam and the numeral 16 denotes a collector for collecting the electron beam after it has passed through the oscillator cavity 10. The cavity 10 is comprised of two spaced apart planar members 11 and 12: the member 11 is fixedly mounted on a support 17 and the member 12 is mounted so as to be movable with respect to the fixed member 11. In this example, the member 12 is attached to a piezo-electric crystal 14 fixed to the support member 17 so that the micrometric movement of the member 12 may be electrically controlled. The members 11 and 12 are formed with centrally located vanes 13A–13B which define a delay line structure. A schematic perspective view of the oscillator cavity 10 is shown in FIG. 3.

Figure 4B:
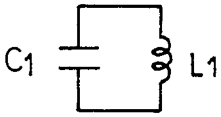
Figure 5A:
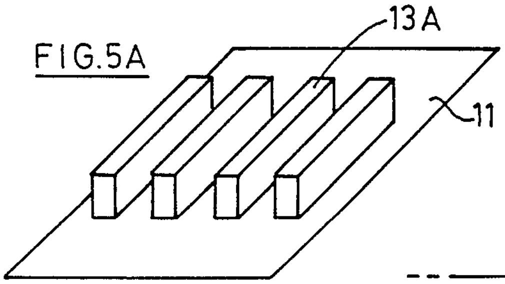
FIGS. 5A and 5B show respectively one half of the delay line structure shown in FIG. 3 and the equivalent electric circuit thereof.
Figure 5B:
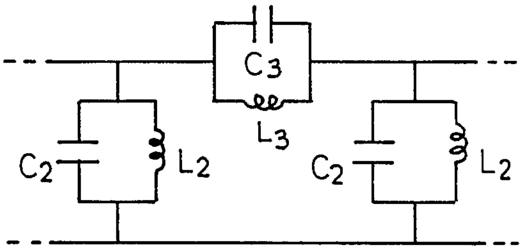

The FIGS. 4A and 4B shows respectively one half of the resonator cavity and the equivalent electrical circuit thereof and the FIGS. 5A and 5B show respectively one half of the delay line and the equivalent electrical circuit thereof. The inductance L1 is formed by the area of the cavity walls 11 and 12 and the capacitance C1 is formed by the gap between the walls 11 and 12. Varying the gap by moving the movable member 12 relative to the fixed member 11 causes the capacitance C1 to be changed, thus changing the resonant frequency while the total inductance of the circuit remains constant.

The delay line circuit comprises a number of resonant circuits L2-C2 coupled to each other by a resonant circuit L3-C3. The inductance L2 is formed by the cross-sectional area of the gap between the vanes 13 and the capacitance C2 is formed by the gap between the vanes. The inductance L3 is formed by the outer surface area of the vanes 13 and the capacitance C3 is formed by the gap between the vane tips on the two members 11 and 12.

Varying the spacing between the members 11 and 12 causes the capacitance C3 to be varied concurrently with capacitance C1, thus resulting in the delay line being tuned stepwise with the resonant cavity. The inductance L2 remains constant. The movement amplitude of the movable member will be small as compared with the mean spacing between the members 11 and 12, thereby allowing the electron beam to experience minor variations only.

Figure 6:
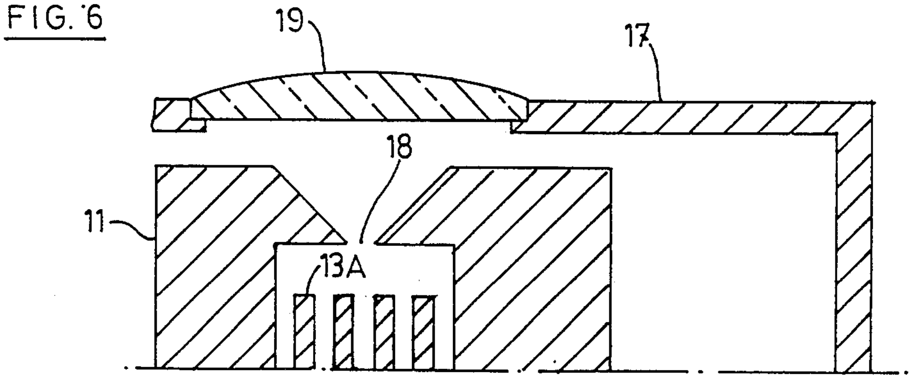
FIG. 6 is a sectional view along line VI—VI in FIG. 2.

The fixed member 11 has an iris 18 cut in its wall as shown in FIG. 6. The R.F. power radiated from the iris is immediately focused into a beam for use in an output circuit by a quasi-optical lens 19 which also forms the vacuum window of the device.

Figure 7:
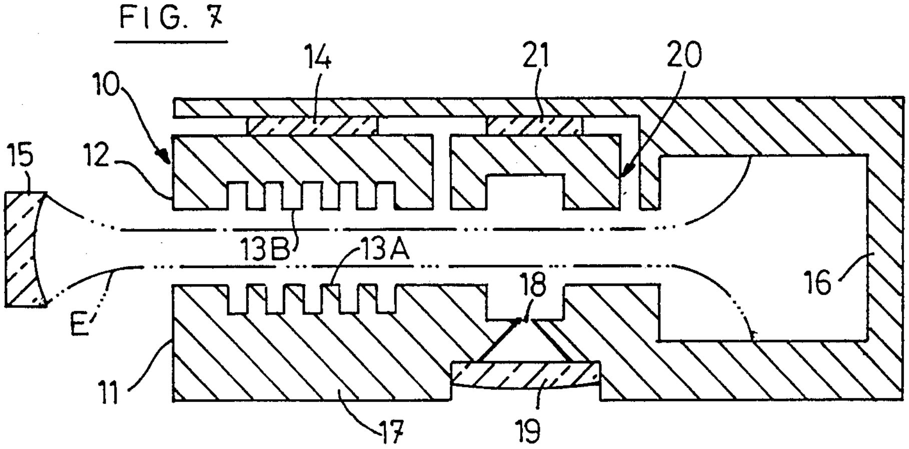
FIGS. 7 and 8 show variations of the embodiment of FIG. 2.

An alternative embodiment is shown in FIG. 7. In this configuration, the R.F. output is taken from an output resonant cavity 20 by way of an iris 18 and a lens 19. The output resonant cavity 20 is excited by the bunched beam excting the oscillator cavity 10 and it is arranged so as to resonate at the oscillator frequency. This arrangement has the advantage that the oscillator cavity is no longer loaded by the output circuit and has a higher Q factor, thus requiring a lower start oscillation current, and also having a more precisely defined frequency of oscillation.

The bunched beam exiting the oscillator cavity 10 will have a high harmonic content. It is therefore possible that the output cavity 6 is sized to operate at a harmonic of the oscillation frequency. This has the advantage that the oscillator cavity 10, which operates at a lower frequency, will have lower R.F. losses, larger size-better thermal properties, lower start oscillation current and easier beam electron optics.

The output resonant cavity can be mounted with the oscillator cavity and tuned by the same piezo-electric crystal, or it may be mounted and tuned separately.

Figure 8:
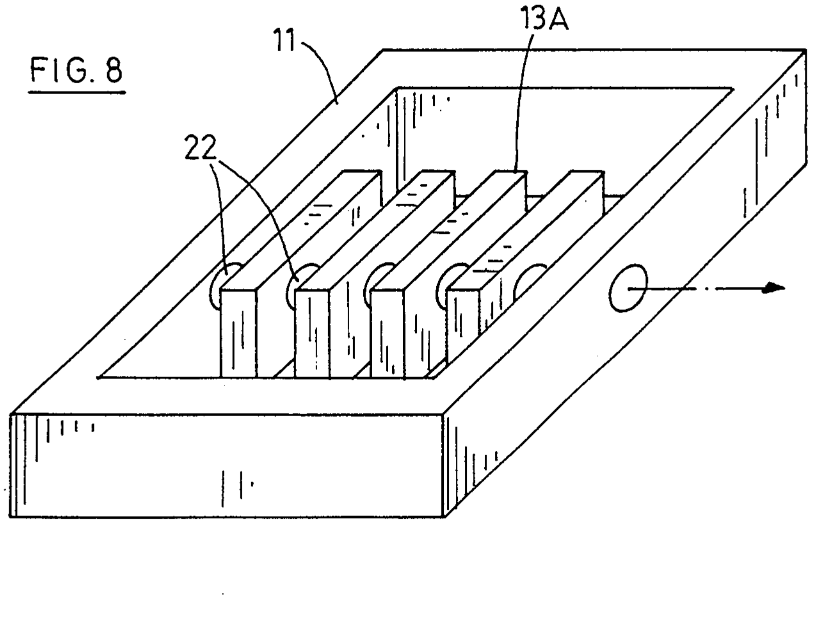

In the exemplary embodiments shown in the appended drawings, the delay line structure 13 is provided in both the stationary and movable members of the cavity 10. However, the delay line structure can be provided in the stationary member 11 only as well, as shown for instance in FIG. 8. In this example, the vanes 13 are formed with holes 22 for the electron beam to pass therethrough. Obviously, the electron beam can be arranged to pass between the two members as well.

It is emphasized that the entire structure of a device as shown in FIGS. 2 and 7 can be easily electro-formed in copper, with the result of manufacturing simplification, especially for sub-millimeter wave dimensions.

It is to be understood that variations to the exemplary embodiment described above can be foreseen. For instance: alternative means of moving the cavity members with respect to each other (e.g. mechanical means), alternative forms of delay line (e.g. meander line) or alternative means of coupling power from the resonant cavity (e.g. waveguide or inductive loop). Also, alternative equivalent circuits for the device structure and alternative methods of analysis can be foreseen, e.g. as tape ladder lines. Further, phase-locking the cavity device can be provided using for example means as disclosed in the paper "Frequency and Phase Synchronization Of A Gyromonotron Using A Modulated Electron Beam" by A. H. McCurdy et al, Proceedings Of The International Electron Devices Meeting, Section 13.5, pages 338–341, IEEE, New York, 1986.

What is claimed is:

1. An extended interaction oscillator or klystron amplifier cavity comprising a resonant cavity arranged for an electron beam to pass therethrough, said cavity being made of two spaced apart parallel planar members said planar members being movable with respect to each other in a direction perpendicular to their major surfaces, at least one of said members having a delay line structure on its inner face within the gap between said two members, means arranged for moving the members relative to each other so as to vary the spacing between said members, thereby to tune the oscillation frequency.

2. A device according to claim 1, wherein said means for moving the members relative to each other comprises a piezo-electric crystal mounted to a support, one of said members being attached to said piezo-electric crystal.

3. An extended interaction oscillator or klystron amplifier comprising an oscillator or klystron cavity comprised of a resonant cavity made of two spaced parallel, substantially planar members movable with respect to each other in a direction perpendicular to their major surfaces, at least one of said members having a delay line structure on its inner face within the gap between said two members, means arranged for moving the members relative to the each other so as to vary the spacing between said members, thereby to tune the oscillation frequency;

a cathode arranged for producing an electron beam to enter and pass through the gap between said two members;

a collector arranged for collection the electron beam after it has passed through said gap; and output coupling means arranged to couple the R.F. output exiting the resonant cavity to an output circuit.

4. A device according to claim 3, wherein the output coupling means comprises an iris cut in the cavity wall, and quasi-optical lens means arranged to focus the R.F. output radiated from said iris into an output beam.

5. A device according to claim 3, wherein the output coupling means comprises an output resonant cavity arranged for being traversed by the R.F. beam exiting the oscillator cavity and for resonating at the oscillator frequency.

* * * * *